(12) United States Patent
Sugiyama

(10) Patent No.: US 7,511,576 B2
(45) Date of Patent: Mar. 31, 2009

(54) HIGH FREQUENCY POWER AMPLIFYING CIRCUIT AND HIGH FREQUENCY ELECTRONIC COMPONENT USING THE SAME

(75) Inventor: Yuta Sugiyama, Tokyo (JP)

(73) Assignee: Hitachi Metals, Ltd., Tokyo (JP)

( * ) Notice: Subject to any disclaimer, the term of this patent is extended or adjusted under 35 U.S.C. 154(b) by 98 days.

(21) Appl. No.: 11/703,196

(22) Filed: Feb. 7, 2007

(65) Prior Publication Data

US 2007/0194856 A1    Aug. 23, 2007

(30) Foreign Application Priority Data

Feb. 21, 2006  (JP) ............................. 2006-043664
Jan. 29, 2007  (JP) ............................. 2007-017949

(51) Int. Cl.
*H03F 3/04*    (2006.01)
(52) U.S. Cl. ....................... 330/296; 330/285
(58) Field of Classification Search ................. 330/296, 330/302, 285
See application file for complete search history.

(56) References Cited

U.S. PATENT DOCUMENTS 6,452,456 B1 *  9/2002  Gharpurey et al. .......... 330/296
6,838,932 B2 *  1/2005  Izumiyama et al. .......... 330/51

FOREIGN PATENT DOCUMENTS

JP          7-193435          7/1995
JP          9-260964          10/1997

* cited by examiner

*Primary Examiner*—Steven J Mottola
(74) *Attorney, Agent, or Firm*—Finnegan, Henderson, Farabow, Garrett & Dunner, LLP

(57) ABSTRACT

In an amplifying circuit using a grounded-emitter high frequency signal amplifying bipolar transistor, the value of impedance of a bias circuit as seen from the base terminal of the bipolar transistor is made optimum in the baseband frequency. More specifically, the resistance value of a base ballast resistor $R_{bias}$ connected to the base terminal of the bipolar transistor is set to a range within ±50% of $[V_t/I_{bq}-(\beta \cdot R_e+R_b)]$ being "ideal resistance value", where $I_{bq}$ is static base current, $\beta$ is the gain of the transistor, $R_e$ and $R_b$ are parasitic resistance of the emitter terminal and base terminal, respectively, and $V_t$ is voltage defined by $(kT/q)$.

19 Claims, 4 Drawing Sheets

HIGH FREQUENCY POWER AMPLIFYING CIRCUIT AND HIGH FREQUENCY ELECTRONIC COMPONENT USING THE SAME

BACKGROUND OF THE INVENTION

1. Field of the Invention

The present invention relates to high frequency power amplifying circuit technology, and more particularly to a power amplifying circuit for a modulated high frequency signal having amplitude fluctuations, such as an OFDM (Orthogonal Frequency Division Multiplexing) signal used in wireless LAN (Local Area Network) or a QPSK (Quadrature Phase Shift Keying) signal used in CDMA (Code Division Multiple Access) mobile telephony.

2. Description of the Related Art

Recently, signal processing techniques used in radio communications are a digital modulation/demodulation scheme; and schemes using modulation involving signal amplitude fluctuations have become a mainstream technique from a viewpoint of improving frequency use efficiency. For example, QPSK (Quadrature Phase Shift Keying) is used in CDMA (Code Division Multiple Access) mobile telephony; OFDM (Orthogonal Frequency Division Multiplexing) digital modulation scheme is used in IEEE (Institute of Electrical and Electronic Engineers) communication standard "802.11a/g"—compliant wireless LAN (Local Area Network). Signals handled in these modulation schemes are each a signal involving amplitude fluctuations.

In order to output as radio wave with no "distortion" such a signal involving amplitude fluctuations, there is needed a linear high frequency power amplifying circuit which has a constant gain irrespective of the amplitude of input signal. For example, Japanese Patent Laid-Open No. 7-193435 (Patent Document 1) has proposed a high frequency amplifying circuit which corrects the bias applied to the transistor in accordance with "distortion components" contained in an input signal, whereby satisfactory linearity can be maintained over a broad band.

In general, as the linear high frequency power amplifying circuit, there has been broadly used a "class A amplifying circuit" which amplifies the whole input signal. However, in the class A amplifying circuit, even when a small signal is inputted, power consumption does not decrease, so its power efficiency is significantly low when used as an amplifying circuit for a signal having amplitude fluctuations. Particularly, this presents a large practical problem that battery drain is noticeable when a class A amplifying circuit is used as the high frequency power amplifying circuit of a mobile radio communications device using a battery as its power source.

To avoid this drawback of class A amplifying circuit, a class AB or class B amplifying circuit can be used. However, in both the class AB amplifying circuit and class B amplifying circuit, the operating point of transistor moves as input electric power varies, so the gain exhibits non-linearity (deviation from a proportional relation between input and output) such as a variation depending on input electric power. To avoid this problem, the "distortion factor correction" technique disclosed in Patent Document 1 can be used; but in this case, the scale of a control circuit for performing such correction is large, thus increasing manufacturing cost, which is an additional problem.

SUMMARY OF THE INVENTION

The present invention has been achieved to address the above problem, and has an object to implement a linear high frequency power amplifying circuit with small power consumption and a high frequency electronic component using the same.

To solve the above problem, a high frequency power amplifying circuit according to the present invention includes: a first transistor, being a bipolar transistor arranged for amplifying a high frequency signal, and having an emitter connected to the ground; and a bias circuit connected to a base terminal of the first transistor, wherein an impedance (R) of the bias circuit as seen from the base terminal of the first transistor satisfies the following impedance relation at baseband frequency.

$$1.5 \cdot [V_t/I_{bq} - (\beta \cdot R_e + R_b)] \geq R \geq 0.5 \cdot [V_t/I_{bq} - (\beta \cdot R_e + R_b)]$$

where $\beta$: gain of the first transistor, $R_e$: parasitic resistance ($\Omega$) of the emitter terminal, $R_b$: parasitic resistance ($\Omega$) of the base terminal, $I_{bq}$: current (static base current: A) flowing into the base terminal of the first transistor when the amplitude of input signal is zero, k: Bolzman constant (J/K), q: absolute value (C) of electronic charge, T: absolute temperature (K), $V_t$: voltage defined by the following formula.

$$V_t = \frac{kT}{q}$$

Also, another high frequency power amplifying circuit according to the present invention includes: a first transistor, being a bipolar transistor arranged for amplifying a high frequency signal, and having an emitter connected to the ground; and a bias circuit connected to a base terminal of the first transistor, wherein an impedance (R) of the bias circuit as seen from the base terminal of the first transistor satisfies the following impedance relation at baseband frequency.

$$V_t/I_{bq} \geq R \geq (V_t/I_{bq} - 16)$$

The high frequency power amplifying circuit according to the present invention can have a configuration in which a base ballast resistor is connected to the base terminal of the first transistor; an impedance ($R_{bias}$) of the base ballast resistor as seen from the base terminal of the first transistor satisfies the impedance relation when $R = R_{bias}$ in the impedance relation.

Also, in the high frequency power amplifying circuit according to the present invention, the bias circuit may include a first and second external terminal, a second and third transistor, and a first to third resistor, wherein: the other end of the first resistor having one end connected to the first external terminal, a collector of the second transistor having an emitter connected to the ground, and a base of the third transistor are connected at a first node; and at the same time, the other end of the second resistor having one end connected to a base of the second transistor, an emitter of the third transistor having a collector connected to the second external terminal, and one end of the third resistor are connected at a second node; and the other end of the third resistor is connected to the base terminal of the first transistor.

The first and second external terminal arranged in the inventive high frequency power amplifying circuit is, for example, a terminal for connection to a control voltage power source. Also, a first wire connected to the first external terminal and a second wire connected to the second external terminal may be electrically connected. Further, a base ballast resistor may be used as the third resistor.

In the inventive high frequency power amplifying circuit, preferably, the slope of gain (dB) relative to input power (dBm) when the amplifier output is 18 dBm is 0.02 dB/dBm or less; and a high frequency electronic component according to the present invention can be obtained when these high frequency power amplifying circuits are used.

According to the present invention, in the high frequency power amplifying circuit including the grounded-emitter bipolar transistor for amplifying a high frequency signal, the value of impedance of the bias circuit as seen from the base terminal of the high frequency signal amplifying transistor is made optimum at the baseband frequency, and thus amplifier linearity can be easily improved. As a result, a linear high frequency power amplifying circuit with small power consumption and a high frequency electronic component using the same can be implemented.

DETAILED DESCRIPTION OF THE PREFERRED EMBODIMENTS

Figure 1:
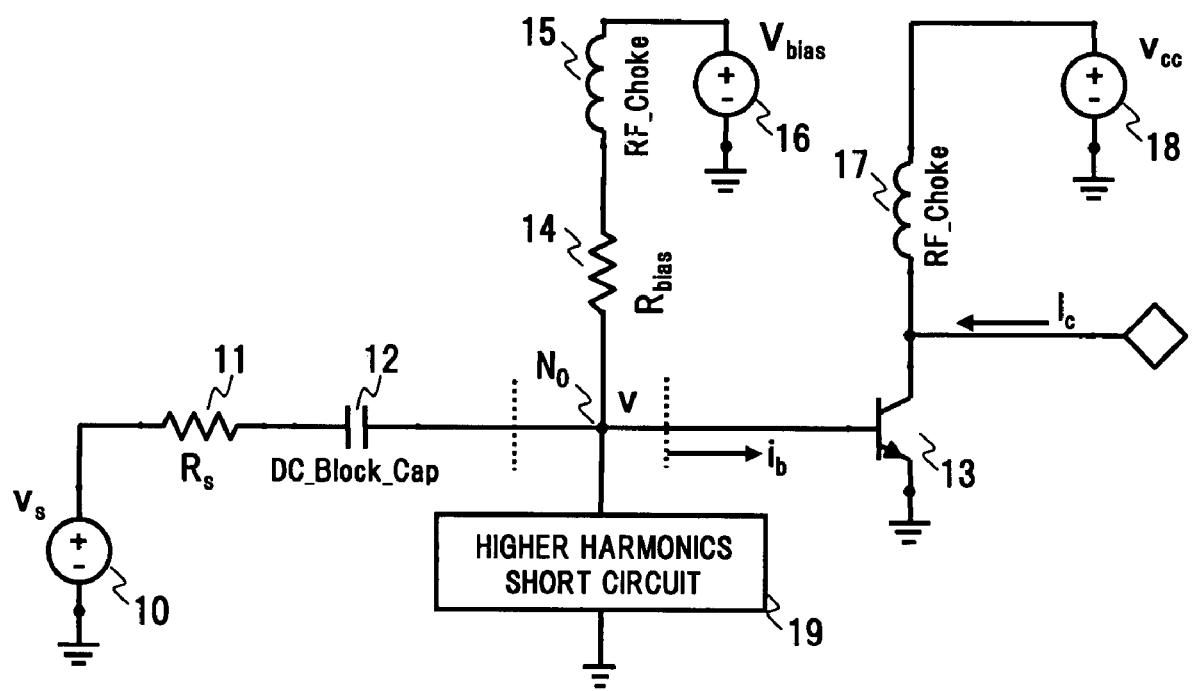
FIG. 1 is an equivalent circuit diagram for explaining design concept of a linear high frequency power amplifying circuit according to the present invention.

FIG. 1 is an equivalent circuit diagram for explaining design concept of a linear high frequency power amplifying circuit according to the present invention. A typical grounded-emitter transistor is used in the amplifier circuit illustrated in FIG. 1. Referring to FIG. 1, reference numeral 13 denotes a bipolar transistor for amplifying a high frequency signal; reference numerals 10, 11 and 12 denote a signal voltage source ($v_s$), a source impedance ($R_s$) and a DC block capacitance, respectively. It is noted that the portion represented by the signal voltage source 10, source impedance 11 and DC block capacitance 12 is obtained by modeling a signal source as seen from a node $N_o$ side, including a matching circuit.

"Bias circuit" is equivalent to a circuit composed of a resistor ($R_{bias}$) 14, a RF choke coil 15 and a voltage source ($V_{bias}$) 16. As the RF choke coil 15, there is selected one which exhibits a high impedance at high frequency and exhibits a low impedance at baseband frequency. In this case, the output impedance (R) of the bias circuit as seen from the node $N_o$ is substantially equal to resistance value $R_{bias}$ of the resistor 14 at baseband frequency.

At the node $N_o$, there are connected a base terminal of the bipolar transistor 13, an input terminal (a connection terminal of the DC block capacitance 12) and the bias circuit (a connection terminal of the resistor 14). Here, to facilitate the analysis, the node $N_o$ is connected to the ground via a higher harmonics short circuit 19 which has an impedance of "0" (zero) in high frequency band. The higher harmonics short circuit 19 is adjusted so as to become open in the operating frequency band.

Here, when the signal voltage of the signal source is $v_s$, assume the following.

$$V_s = V_s \cdot \cos \omega t \qquad \text{(Formula 1)}$$

where $V_s$ is voltage amplitude.

In this case, since the node $N_o$ is connected to the ground at higher harmonics, a voltage v of the node $N_o$ can be expressed as Formula (2).

$$v = V_{0_q} + V_x + V_1 \cdot \cos \omega t \qquad \text{(Formula 2)}$$

where $V_{o_q}$ is DC voltage when the input signal is 0; $V_x$ is a variation of DC voltage component caused by the rectifying operation between the base and emitter of the bipolar transistor 13 when a finite signal is inputted; $V_1$ is voltage amplitude at basic frequency.

The current flowing in the base terminal of the bipolar transistor 13 can be expressed as Formula (3).

$$i_b = \frac{I_s}{\beta} \cdot [\exp(v/V_t) - 1] \qquad \text{(Formula 3)}$$

where $I_s$ is saturation current of the bipolar transistor 13; $\beta$ is current gain. Also, $V_t$ is voltage defined as Formula (4).

$$V_t = \frac{kT}{q} \qquad \text{(Formula 4)}$$

where k is Bolzman constant (J/K); q is the absolute value (C) of electronic charge; T is absolute temperature (K).

Under the ordinary operating conditions of the amplifying circuit, voltage v of the node $N_o$ is sufficiently higher than the above voltage $V_t$ ($v \gg V_t$). Accordingly, the above Formula (3) can be approximated by Formula (5).

$$i_b = \frac{I_s}{\beta} \cdot \exp(v/V_t) \qquad \text{(Formula 5)}$$

When $I_{bp}$ is static base current when voltage amplitude $V_s = 0$, $I_{bp}$ is expressed as Formula (6).

$$I_{bq} = \frac{I_s}{\beta} \cdot \exp(V_{0q}/V_t) \qquad \text{(Formula 6)}$$

Here, when $V_{bias}$ is voltage of the base bias voltage source 16, $V_{bias}$ can be expressed as Formula (7).

$$V_{bias} = V_{0_q} + I_{bq} \cdot R_{bias} \qquad \text{(Formula 7)}$$

From the above Formulae (5), (6) and (2), Formula (8) can be obtained.

$$i_b = I_{bq} \cdot \frac{\exp\left[\frac{v}{V_t}\right]}{\exp\left[\frac{V_{0q}}{V_t}\right]} \quad \text{(Formula 8)}$$

$$= I_{bq} \cdot \frac{\exp\left[\left(\frac{V_{0q}}{V_t}\right) + \left(\frac{V_x}{V_t}\right) + \left(\frac{V_1}{V_t}\right) \cdot \cos\omega t\right]}{\exp\left[\frac{V_{0q}}{V_t}\right]}$$

$$= I_{bq} \cdot \frac{\exp\left(\frac{V_{0q}}{V_t}\right) \cdot \exp\left(\frac{V_x}{V_t}\right) \cdot \exp\left(\frac{V_1 \cdot \cos\omega t}{V_t}\right)}{\exp\left[\frac{V_{0q}}{V_t}\right]}$$

$$= I_{bq} \cdot \exp\left(\frac{V_x}{V_t}\right) \cdot \exp\left(\frac{V_1 \cdot \cos\omega t}{V_t}\right)$$

Consequently, the DC component ($I_{bo}$) of current flowing into the base terminal of the bipolar transistor 13 is expressed as Formula (9) obtained by averaging the above Formula (8) over a time period T.

$$I_{b0} = \frac{1}{T} I_{bq} \cdot \exp(V_x / V_t) \cdot \int_0^T \exp(V_1 \cdot \cos\omega t / V_t) dt \quad \text{(Formula 9)}$$

This DC component $I_{bo}$ is equal to DC current flowing from the bias circuit into the node $N_o$. Accordingly, using the above Formula (7), $$I_{b0} = (V_{bias} - (V_{0q} + V_x))/R_{bias} \quad \text{(Formula 10)}$$
$$= \{(V_{0q} + I_{bq} \cdot R_{bias}) - (V_{0q} + V_x)\}/R_{bias}$$
$$= I_{bq} - V_x/R_{bias}$$

By applying Fourier transform to $i_b$ determined by the above Formula (8), basic frequency component ($I_{b1}$) of current flowing into the base terminal of the bipolar transistor 13 can be expressed as Formula (11).

$$I_{b1} = \frac{2}{T} I_{bq} \cdot \exp(V_x/V_t) \cdot \int_0^T \exp(V_1 \cdot \cos\omega t/V_t) \cdot \cos\omega t \, dt \quad \text{(Formula 11)}$$

Also, this basic frequency component is equal to basic frequency current flowing from the signal source into the node $N_o$. Accordingly, the following relation holds between signal voltage amplitude Vs of the signal source, voltage amplitude $V_1$ at basic frequency and source impedance $R_s$.

$$I_{b1} = (V_s - V_1)/R_s \quad \text{(Formula 12)}$$

An input impedance ($R_{in}$) of the base terminal when a small signal is inputted to the bipolar transistor 13 can be expressed as an equivalent circuit being a RC parallel circuit, but the capacitive component of this equivalent circuit can be compensated for using an impedance matching circuit. Thus, when such capacitive component is omitted, input impedance ($R_{in}$) can be expressed as the following Formula (13).

$$R_{in} = V_t/I_{bq} \quad \text{(Formula 13)}$$

Here, to secure impedance matching at basic frequency, the value of source impedance $R_s$ must be equal to the value of the above base terminal input impedance $R_{in}$ ($R_S = R_{in}$). Accordingly, the source side impedance as seen from the node $N_o$ is expressed as follows.

$$R_s = V_t/I_{bq} \quad \text{(Formula 14)}$$

When variable "ωt" in the above Formulae (9) and (11) is replaced by "2πu", using the above Formulae (10) and (12), the following simultaneous equations are derived from the above Formulae (9) and (11).

$$I_{bq} - \frac{V_x}{R_{bias}} = I_{bq} \cdot \exp(V_x/V_t) \cdot \int_0^1 \exp(V_1 \cos 2\pi u/V_t) du \quad \text{(Formula 15)}$$

$$(V_s - V_1) \frac{I_{bq}}{V_t} = \quad \text{(Formula 16)}$$
$$2I_{bq} \cdot \exp(V_x/V_t) \cdot \int_0^1 \exp(V_1 \cos 2\pi u/V_t) \cdot \cos 2\pi u \, du$$

When the above simultaneous equations are solved by determining $I_{bq}$ and $R_{bias}$, $V_x$ and $V_1$ are determined as a function of $V_S$. Also, $I_b$, and $I_{b1}$ are determined from the above Formulae (10) and (12).

First, the above Formula (15) will be explained. The integral part is a zero-order "first type modified Bessel function" ($I_0$) of variable $x=(V_1/V_t)$. When this is defined as $I_0(x)$ ($=I_0(V_1/V_t)$), the following Formula (17) is derived.

$$I_0\left(\frac{V_1}{V_t}\right) = \int_0^1 \exp(V_1 \cos 2\pi u/V_t) du \quad \text{(Formula 17)}$$

The zero-order first type modified Bessel function $I_0(x)$ can be expanded into polynomial expression, and it can be approximated by $I_0(x)=[1+(x^2/4)]$ in the range of x being sufficiently smaller than 1. Also, the exponential function can be approximated by $\exp(x)=(1+x)$. Accordingly, the following formula is derived from the above Formula (15).

$$\left(\frac{I_{bq}}{V_t} + \frac{1}{R_{bias}}\right) V_x = -\frac{1}{4} I_{bq} \cdot \left(\frac{V_1}{V_t}\right)^2 \quad \text{(Formula 18)}$$

The above Formula (16) will now be studied. The integral part is a first-order "first type modified Bessel function" of variable $x=(V_1/V_t)$. When this is defined as $I_1(x)$ ($=I_1(V_1/V_t)$), the following Formula (19) is derived.

$$I_1\left(\frac{V_1}{V_t}\right) = \int_0^1 \exp(V_1 \cos 2\pi u/V_t) \cdot \cos 2\pi u \, du \quad \text{(Formula 19)}$$

Here, the first-order first type modified Bessel function $I_1(x)$ can also be expanded into polynomial expression, and it can be approximated by $I_1(x)=[(x/2)+(x^3/16)]$. When this approximation is applied to the above Formula (16) and at the same time, the above Formula (18) is taken into consideration, it can be seen that output collector current have a proportional relation with basic frequency current $I_{b1}$ when $R_{bias}$ is set so that $I_{b1}$ have a proportional relation with $V_S$, and thus a linear operation of the amplifying circuit can be expected. And from the above Formula (11), it can be seen that if $V_1$ is proportional to $V_S$, the linear operation can be implemented. From the above described conditions, when $R_{bias}$ is determined so that the coefficient of the cube of $V_1$ becomes zero, the following relation can be derived.

$$R_{bias} = V_t/I_{bq} \quad \text{(Formula 20)}$$

Generally, the above relation holds in bipolar transistors; and it also holds in homojunction bipolar transistors using silicon substrate and in heterojunction bipolar transistors using gallium arsenide substrate.

Meanwhile, actual bipolar transistors inevitably have parasitic resistance at the base terminal or emitter terminal thereof. This means that, when a bipolar transistor is actually used, the above parasitic resistance must be subtracted in determining the value of $R_{bias}$. Particularly, a parasitic resistance ($R_e$) of the emitter terminal creates negative feedback to the base terminal when emitter current is amplified by current amplification. Accordingly, the optimal value of $R_{bias}$ in actual use is smaller by the sum of a value ($=\beta \cdot R_e + R_b$) obtained by multiplying emitter terminal parasitic resistance ($R_e$) by current gain ($\beta$) and the base terminal parasitic resistance ($R_b$), than the value determined by the above Formula (20).

In the bipolar transistor used in a power amplifying circuit, the emitter terminal parasitic resistance ($R_e$) is about 0.15Ω at the most; the base terminal parasitic resistance ($R_b$) is about 1Ω; and current gain ($\beta$) is about 100 times at the most. Consequently, the optimal resistance value (Ω: impedance (R) of the bias circuit as seen from the base terminal) of $R_{bias}$ can be in the following range; and with $R_{bias}$ (impedance (R) of the bias circuit as seen from the base terminal) in the above range, the linearity improvement effect of the actually used amplifier can be expected.

$$V_t/I_{bq} \geq R_{bias} \geq (V_t/I_{bq} - 16) \quad \text{(Formula 21)}$$

As a result of studying in detail the influence of the resistance value of the above $R_{bias}$ on the amplifier linearity improvement effect, the present inventor has found that, when the bipolar transistor used in the amplifier, for amplifying a high frequency signal, and the value $R_{bias}$ of the resistance arranged in the bias circuit satisfy the following relation, practically adequate amplifier linearity can be achieved.

$$1.5 \cdot [V_t/I_{bq} - (\beta \cdot R_e + R_b)] \geq R_{bias} \geq 0.5 \cdot [V_t/I_{bq} - (\beta \cdot R_e + R_b)] \quad \text{(Formula 22)}$$

That is, if the resistance value (Ω) of $R_{bias}$ is made to fall into a range within ±50% of $[V_t/I_{bq} - (\beta \cdot R_e + R_b)]$ being "ideal resistance value", practically adequate amplifier linearity can be achieved. More specifically, the deviation of gain (dB) when the input power is in a range of −10 to +5 dBm can be suppressed to 0.3 dB or less. Also, the slope of gain (dB) relative to input power (dBm) at an amplifier output of 18 dBm can be suppressed to 0.02 dB/dBm or less.

EXAMPLES

An embodiment of the present invention will be described below with reference to the accompanying drawings.

Figure 2:
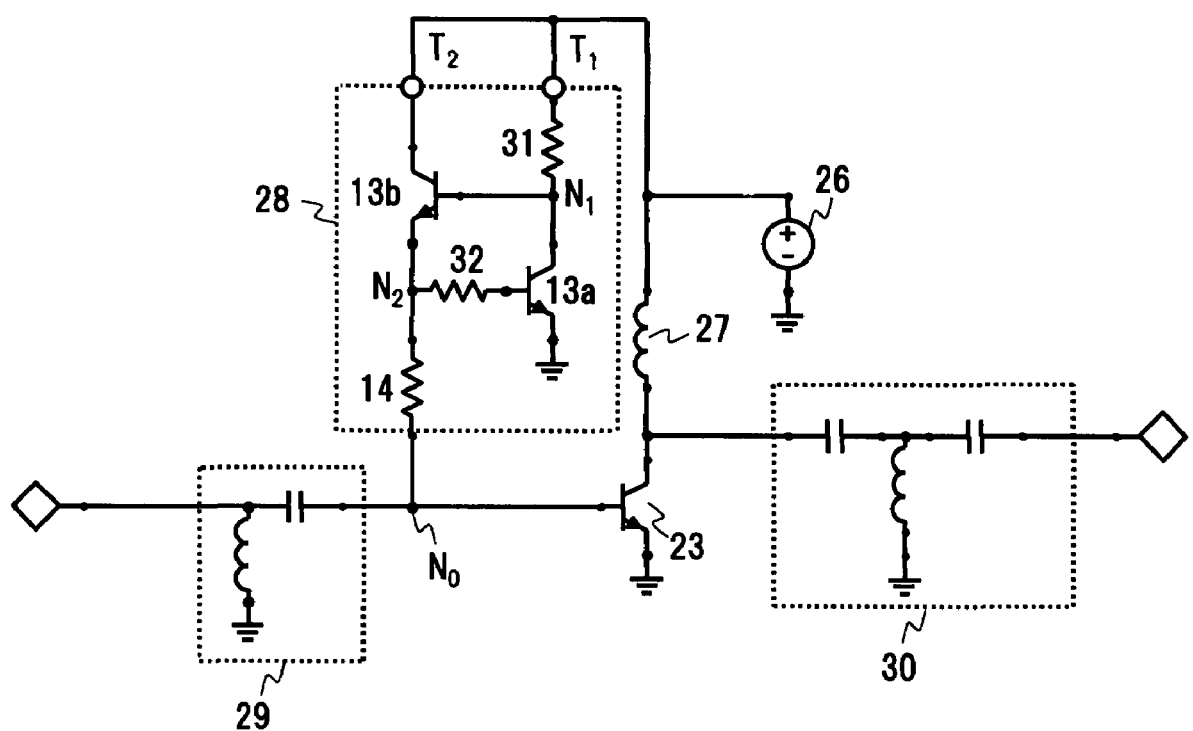
FIG. 2 is an equivalent circuit diagram for explaining a configuration of the linear high frequency power amplifying circuit according to an example.

FIG. 2 is an equivalent circuit diagram for explaining a configuration of a linear high frequency power amplifying circuit according to the present example. Referring to FIG. 2, reference numeral 28 denotes a base bias voltage generation circuit (bias circuit); 29 denotes an input matching circuit equivalent to a capacitor and a RF choke coil; 30 denotes an output matching circuit equivalent to two capacitors and a RF choke coil.

Reference numeral 23 denotes a bipolar transistor for amplifying a high frequency signal. In the present example, as this bipolar transistor, there was used a heterojunction type bipolar transistor having 16 emitter fingers connected in parallel, each emitter finger 2 having a width of 2 μm and a length of 40 μm, formed on GaAs substrate.

The base of the bipolar transistor 23 for amplifying a high frequency signal is composed of 12 base fingers connected in parallel, and connected to the above described base bias voltage generation circuit 28 and input matching circuit 29 at a node $N_0$. A DC power source 26 is connected via an inductor 27 of 10 nH to the collector terminal of the bipolar transistor 23. The basic frequency of input signal is set to 2.4 GHz; the static base current when the input signal is not present is set to 1 mA. Further, connected to a transmission path between the collector terminal and the inductor 27 is the output matching circuit 30. It is noted that, when the gain of the bipolar transistor 23, the parasitic resistance of emitter terminal, and the parasitic resistance of base terminal are $\beta$, $R_e$ (Ω) and $R_b$ (Ω), respectively, the value of the above formula ($\beta \cdot R_e + R_b$) is 9Ω.

The base bias voltage generation circuit 28 includes two transistors (13a, 13b) and three resistors (31, 32, 14). Both of the above two transistors (13a, 13b) are a bipolar transistor. Thus, in the following description, the above bipolar transistor 23 is referred to as "first transistor"; the transistor 13a as "second transistor"; the transistor 13b as "third transistor".

The base bias voltage generation circuit 28 has arranged therein two external terminals ($T_1$, $T_2$) connected to the DC power source 26 of 3.3 V. These external terminals (or wires connected to the respective terminals) are electrically connected to each other. Connected to the external terminal $T_1$ is the other end of the first resistor 31 having one end thereof connected to a node $N_1$. Connected to this node $N_1$ are: the collector of the second transistor 13a having the emitter connected to the ground and the base connected via the second resistor 32 to a node $N_2$; and the base of the third transistor 13b. The collector of the third transistor 13b is connected to the second external terminal $T_2$; the emitter is connected to the node $N_2$; the other end of the third resistor 14 having one end thereof connected to the node $N_2$ is connected via the node $N_0$ to the base terminal of the first transistor 23.

The above third resistor 14 is a ballast resistor connected to the base finger. The baseband impedance of the base bias voltage generation circuit 28 as seen from this resistor 14 is significantly small due to feedback by the transistors 13a and 13b, so the output impedance of the bias circuit as seen from the node $N_0$ should be substantially equal to the value of the resistor 14.

In the present example, no circuit for connecting the node $N_0$ to the ground at higher harmonics is particularly arranged. This is because it is expected that the base-emitter capacitance inherently included in the bipolar transistor performs the similar operation.

Figure 3:
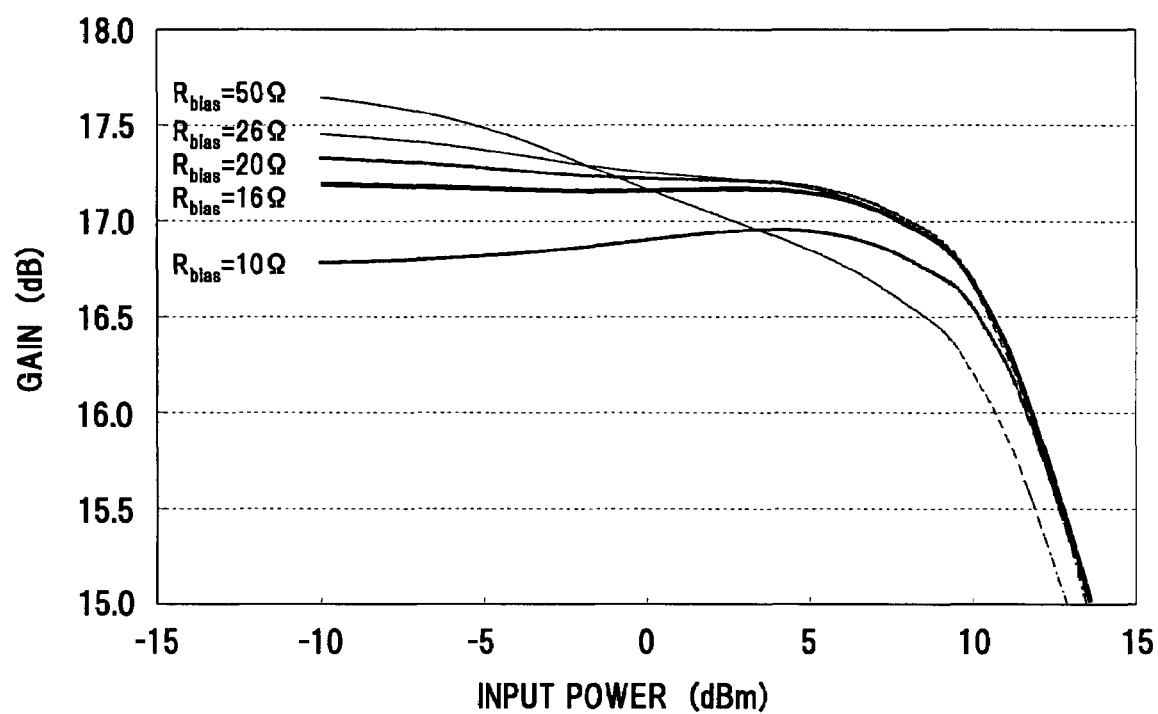
FIG. 3 is a view for explaining bias-circuit baseband impedance dependence of power gain of the linear high frequency power amplifying circuit according to the present invention.

FIG. 3 is a view for explaining third-resistor 14 value ($R_{bias}$: effective "baseband impedance of the bias circuit") dependence of power gain relative to input power of the linear high frequency power amplifying circuit. This dependence is one observed at room temperature (300 K); and $V_t/I_{bq}$ is 26Ω.

First, when the resistance value ($R_{bias}$) of the resistor 14 is set to 10Ω, the baseband impedance of the bias circuit as seen from the node $N_0$ is about 10Ω. When the input power is in a range of −5 to +5 dBm, slightly large gain expansion is observed; but with the input power in a range of −10 to +5 dBm, the deviation of gain is about 0.19 dB, which is small. Such small-deviation dependence of power gain can be observed at resistances values of 16Ω, 20Ω and 26Ω. In contrast, when the resistance value $R_{bias}$ is set to 50Ω, there can be observed a phenomenon (gain contraction) that as the input signal increases, the gain lowers sharply.

As described above, according to the present example, the value of $V_t/I_{bq}$ is 26Ω, and ($\beta \cdot R_e + R_b$) is 9Ω. Accordingly, the value of $[V_t/I_{bq} - (\beta \cdot R_e + R_b)]$ being "ideal resistance value" of $R_{bias}$ is determined to be about 17Ω (26Ω–9Ω); and the "range within ±50%" of the "ideal resistance value" means a resistance value of about 8 to 26Ω.

That is, the result illustrated in FIG. 3 clarifies the fact that, when the impedance (R) of the bias circuit as seen from the base terminal is within the resistance range shown in the above Formula (22) when $R=R_{bias}$, linearity can be improved, as compared to when R is outside that range. And when this impedance is set to a value within the above range, the deviation of gain in an input power range of −10 to +5 dBm is suppressed to a practically adequate value (0.3 dB or less).

When $R_{bias}$ is 26Ω being the upper limit of the resistance value range of $R_{bias}$ according to the present embodiment, the degree of gain contraction is significantly improved, compared to when $R_{bias}$ is 50Ω; but the gain contraction itself is clearly observed over a broad range of input power. In contrast, when the resistance value $R_{bias}$ is set to 16Ω to 20Ω, a substantially constant gain is observed over an input range of −10 to +5 dBm and at the same time, the deviation of gain is suppressed to 0.15 dB or less, and thus it can be seen that linearity is further improved, compared to when the resistance value $R_{bias}$ is 10Ω (the deviation of gain being about 0.19 dB).

That is, when the resistance value of $R_{bias}$ (Ω: being actually the impedance (R) of the bias circuit as seen from the base terminal) satisfies the following relation (23), linearity can be further improved.

$$1.2 \cdot [V_t/I_{bq}-(\beta \cdot R_e+R_b)] \geq R_{bias} \geq 0.8 \cdot [V_t/I_{bq}-(\beta \cdot R_e+R_b)] \quad \text{(Formula 23)}$$

In "IEEE802.11 g" which has been broadly used as the wireless LAN standard, it is defined that the average output of high frequency amplifier is 18 dBm. Consequently, linearity at an output of 18 dBm is most important for wireless LAN.

Figure 4:
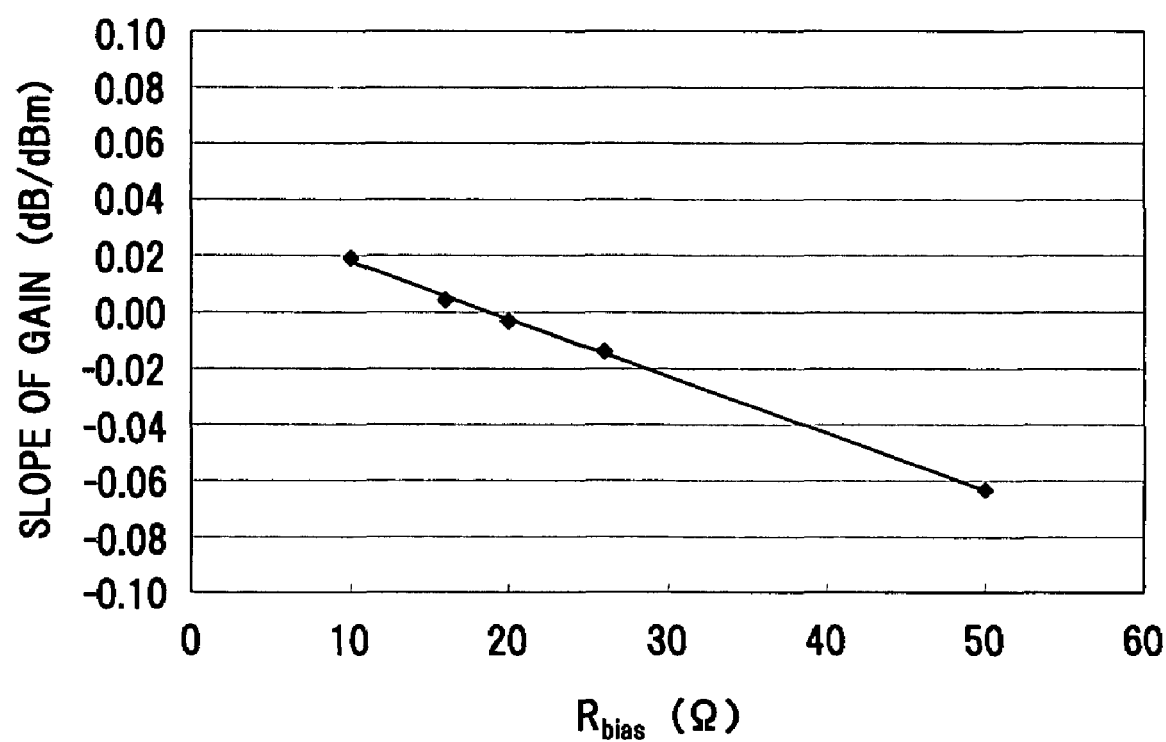
FIG. 4 is a view illustrating a relation between bias-circuit baseband impedance and gain slope at an amplifier output of 18 dBm.

FIG. 4 is a view obtained by determining $R_{bias}$ dependence of gain slope with respect to an input power corresponding to an amplifier output of 18 dBm. The expression "gain slope" used herein means a variation of gain divided by a variation of input power; and when gain slope is zero, linearity is optimum. The slopes at the values of $R_{bias}$ (10Ω, 16Ω, 20Ω, 26Ω and 50Ω) are 0.019, 0.004, −0.003, −0.014 and −0.063 (dB/dBm), respectively.

As evident from FIG. 4, when the value of $R_{bias}$ is 10 Ω, 16Ω, 20Ω or 26Ω, i.e., when the value of $R_{bias}$ is in "a range within ±50% of $[V_t/I_{bq}-(\beta \cdot R_e+R_b)]$ being "ideal resistance value", a practically adequate slope (0.02 dB/dBm or less) can be achieved. When the value of $R_{bias}$ is set to a range of 14Ω to 24Ω, the slope becomes 0.01 dB/dBm or less, allowing further improvement of linearity. It is noted that, when the input power is 5 dBm or more, gain reduction occurs, but this is presumably caused by transistor effects such as the Kirk effect.

In the above description, the effectiveness of the present invention has been verified.

The above described principle can also be applied to a method of adjusting a high frequency power amplifying circuit. More specifically, in a high frequency power amplifying circuit using a first bipolar transistor having the emitter connected to the ground, for amplifying a high frequency signal, when the gain of the first bipolar transistor is β, parasitic resistance of emitter terminal is $R_e$ (Ω), parasitic resistance of base terminal is $R_b$ (Ω), current flowing into the base terminal of the first bipolar transistor when the amplitude of input signal is zero is $I_{bq}$ (A), the Bolzman constant is k (J/K), the absolute value of electronic charge is q (C), the absolute temperature is T (K), voltage defined by the following formula is $V_t$, $$V_t = \frac{kT}{q}$$

then, if circuit adjustment is made so that the impedance ($R_{bias}$) of the bias circuit as seen from the base terminal of the first bipolar transistor satisfies the following relation at baseband frequency, amplifier linearity can be improved.

$$1.5 \cdot [V_t/I_{bq}-(\beta \cdot R_e+R_b)] \geq R_{bias} \geq 0.5 \cdot [V_t/I_{bq}-(\beta \cdot R_e+R_b)]$$

The inventive high frequency power amplifying circuit can be mounted on a dielectric substrate or the like, thereby constituting a high frequency electronic component. The high frequency electronic components includes a high frequency amplifier module having amplification function as its main configuration, and a high frequency composite module integrated with another function such as a switch circuit.

In a method of fabricating the high frequency electronic component using the high frequency power amplifying circuit, when the high frequency power amplifying circuit is adjusted based on the above described approach, the high frequency electronic component with excellent amplifier linearity can be provided.

In the method of adjusting the high frequency power amplifying circuit and the method of fabricating the high frequency electronic component, also, the deviation of gain in an input power range of −10 to +5 dBm is preferably suppressed to 0.3 dB or less, further to 0.15 dB or less. Also, the slope of gain with respect to input power when the amplifier output is 18 dBm is preferably suppressed to 0.02 dB/dBm or less, further to 0.01 dB/dBm.

The inventive linear high frequency power amplifying circuit can be used in high frequency radio communications devices such as a mobile phone and wireless LAN terminal using modulation scheme involving amplitude fluctuations.

What is claimed is:

1. A high frequency power amplifying circuit for outputting an orthogonal frequency-division multiplexed signal as a radio wave, comprising:
   a first bipolar transistor arranged for amplifying a high frequency signal, and having an emitter terminal connected to ground; and
   a bias circuit connected to a base terminal of the first transistor, wherein impedance (R) of the bias circuit as seen from the base terminal of the first transistor satisfies the following impedance relation at baseband frequency:

$$1.5 \cdot \left[\frac{Vt}{Ibq} - (\beta \cdot Re + Rb)\right] \geq R \geq 0.5 \cdot \left[\frac{Vt}{Ibq} - (\beta \cdot Re + Rb)\right],$$

where β is the gain of the first transistor,
Re is the parasitic resistance (Ω) of the emitter terminal,
Rb is the parasitic resistance (Ω) of the base terminal,
Ibq is the static current flowing into the base terminal of the first transistor when the amplitude of an input signal is zero,
k is the Bolzman constant (J/K),
q is the absolute value (C) of electronic charge,
T is the absolute temperature (K), and
Vt is the voltage defined by the following formula:

$$V_t = \frac{kT}{q}.$$

2. The high frequency power amplifying circuit according to claim 1, wherein the impedance R satisfies the following impedance relation:

$$1.2 \cdot \left[\frac{Vt}{Ibq} - (\beta \cdot Re + Rb)\right] \geq R \geq 0.8 \cdot \left[\frac{Vt}{Ibq} - (\beta \cdot Re + Rb)\right].$$

3. The high frequency power amplifying circuit according to claim 1 wherein:
a base ballast resistor is connected to the base terminal of the first transistor; and
an impedance ($R_{bias}$) of the base ballast resistor as seen from the base terminal of the first transistor satisfies the impedance relation when R=$R_{bias}$ in the impedance relation.

4. The high frequency power amplifying circuit according to claim 1, wherein:
the bias circuit includes a first external terminal, a second external terminal, a second transistor, a third transistor, a first resistor, a second resistor, and a third resistor,
one end of the first resistor is connected to the first external terminal,
an emitter terminal of the second transistor is connected to ground,
the other end of the first resistor, a collector terminal of the second transistor, and a base terminal of the third transistor are connected at a first node,
one end of the second resistor is connected to a base terminal of the second transistor,
a collector terminal of the third transistor is connected to the second external terminal,
the other end of the second resistor, an emitter terminal of the third transistor, and one end of the third resistor are connected at a second node, and
the other end of the third resistor is connected to the base terminal of the first transistor.

5. The high frequency power amplifying circuit according to claim 4, wherein the first external terminal and the second external terminal are connected to a control voltage power source.

6. The high frequency power amplifying circuit according to claim 4, wherein the first external terminal is electrically connected to the second external terminal.

7. The high frequency power amplifying circuit according to claim 4, wherein the third resistor is a base ballast resistor.

8. The high frequency power amplifying circuit according to claim 1, wherein the slope of gain (dB) relative to input power (dBm) when the amplifier output is 18 dBm is 0.02 dB/dBm or less.

9. The high frequency power amplifying circuit according to claim 1, wherein the deviation of gain (dB) when the input power is in a range of −10 to +5 dBm is 0.3 dB or less.

10. A high frequency electronic component using a high frequency power amplifying circuit according to claim 1.

11. A high frequency power amplifying circuit for outputting an orthogonal frequency-division multiplexed signal as a radio wave, comprising:
a first bipolar transistor, arranged for amplifying a high frequency signal, and having an emitter connected to ground; and
a bias circuit connected to a base terminal of the first transistor, wherein an impedance (R) of the bias circuit as seen from the base terminal of the first transistor satisfies the following impedance relation at baseband frequency:

$$\frac{Vt}{Ibq} \geq R \geq \left(\frac{Vt}{Ibq} - 16\right),$$

where Ibq is the static current flowing into the base terminal of the first transistor when the amplitude of input signal is zero,
k is the Bolzman constant (J/K),
q is the absolute value (C) of electronic charge,
T is the absolute temperature (K), and
Vt is the voltage defined by the following formula:

$$V_t = \frac{kT}{q}.$$

12. The high frequency power amplifying circuit according to claim 11, wherein:
a base ballast resistor is connected to the base terminal of the first transistor; and
an impedance ($R_{bias}$) of the base ballast resistor as seen from the base terminal of the first transistor satisfies the impedance relation when R=$R_{bias}$ in the impedance relation.

13. The high frequency power amplifying circuit according to claim 11, wherein:
the bias circuit includes a first external terminal, a second external terminal, a second transistor, a third transistor, a first resistor, a second resistor, and a third resistor,
one end of the first resistor is connected to the first external terminal,
an emitter terminal of the second transistor is connected to ground,
the other end of the first resistor, a collector terminal of the second transistor, and a base terminal of the third transistor are connected at a first node,
one end of the second resistor is connected to a base terminal of the second transistor,
a collector terminal of the third transistor is connected to the second external terminal,
the other end of the second resistor, an emitter terminal of the third transistor, and one end of the third resistor are connected at a second node, and
the other end of the third resistor is connected to the base terminal of the first transistor.

14. The high frequency power amplifying circuit according to claim 13, wherein the first external terminal and the second external terminal are connected to a control voltage power source.

15. The high frequency power amplifying circuit according to claim 13, wherein the first external terminal is electrically connected to the second external terminal.

16. The high frequency power amplifying circuit according to claim 13, wherein the third resistor is a base ballast resistor.

17. The high frequency power amplifying circuit according to claim 11, wherein the slope of gain (dB) relative to input power (dBm) when the amplifier output is 18 dBm is 0.02 dB/dBm or less.

18. The high frequency power amplifying circuit according to claim 11, wherein the deviation of gain (dB) when the input power is in a range of −10 to +5 dBm is 0.3 dB or less.

19. A high frequency electronic component using a high frequency power amplifying circuit according to claim 11.

* * * * *

UNITED STATES PATENT AND TRADEMARK OFFICE
CERTIFICATE OF CORRECTION

PATENT NO. : 7,511,576 B2
APPLICATION NO. : 11/703196
DATED : March 31, 2009
INVENTOR(S) : Yuta Sugiyama Page 1 of 1

It is certified that error appears in the above-identified patent and that said Letters Patent is hereby corrected as shown below:

\*\*In claim 1, column 10, line 53, "Re" should read --$R_e$--.

\*\*In claim 1, column 10, line 54, "Rb" should read --$R_b$--.

\*\*In claim 1, column 10, line 55, "Ibq" should read --$I_{bq}$--.

\*\*In claim 1, column 10, line 61, "Vt" should read --$V_t$--.

\*\*In claim 11, column 11, line 60, "transistor," should read --transistor--.

\*\*In claim 11, column 12, line 7, "Ibq" should read --$I_{bq}$--.

\*\*In claim 11, column 12, line 13, "Vt" should read --$V_t$--.

Signed and Sealed this

Ninth Day of June, 2009

JOHN DOLL
*Acting Director of the United States Patent and Trademark Office*